United States Patent [19]

Elliott et al.

[11] 4,377,806

[45] Mar. 22, 1983

[54] PARALLEL TO SERIAL CONVERTER

[75] Inventors: Joseph E. Elliott, Green Valley; John R. Elliott, Tucson, both of Ariz.

[73] Assignee: International Business Machines Corporation, Armonk, N.Y.

[21] Appl. No.: 263,379

[22] Filed: May 13, 1981

[51] Int. Cl.³ .......................................... H03K 13/258
[52] U.S. Cl. .............................................. 340/347 DD
[58] Field of Search ................ 340/347 DD; 364/900, 364/200

[56] References Cited

U.S. PATENT DOCUMENTS

| | | | |
|---|---|---|---|
| 3,267,460 | 8/1966 | Merrell | 340/347 DD |
| 3,274,341 | 9/1966 | Allen | 340/347 DD |
| 3,334,181 | 8/1967 | Bartlett | 340/347 DD |
| 3,396,382 | 8/1968 | Jones | 340/347 DD |
| 3,505,659 | 4/1970 | Kelly | 340/347 DD |
| 3,914,553 | 10/1975 | Melindo | 340/347 DD |
| 4,041,453 | 8/1977 | Umeda | 340/347 DD |

Primary Examiner—C. D. Miller
Attorney, Agent, or Firm—James M. Thomson

[57] ABSTRACT

A parallel to serial converter is described for recording channel applications, wherein a coded symbol comprising a plural number of bits is to be rotated or converted to a serial stream. The converter includes a variable delay section which accepts the parallel code inputs on a plurality of lines and delays each input bit a predetermined number of counts, depending upon which line it is input on. The delay unit supplies a selector array of gates with bit signals, and the selector array reorders the bits into the desired serial stream. An output register is provided to reclock the serial stream prior to further channel processing.

2 Claims, 2 Drawing Figures

SYMBOL OUTPUT SEQUENCE

| OUTPUT | $T_1$ | $T_2$ | $T_3$ | $T_4$ | $T_1'$ | $T_2'$ |
|---|---|---|---|---|---|---|
| $O_1$ | $P_2$ | $P_3$ | $P_4$ | $P_1$ | $P_2$ | $P_3$ |
| $O_2$ | $P_1$ | $P_2$ | $P_3$ | $P_4$ | $P_1$ | $P_2$ |
| $O_3$ | $P_4$ | $P_1$ | $P_2$ | $P_3$ | $P_4$ | $P_1$ |
| $O_4$ | $P_3$ | $P_4$ | $P_1$ | $P_2$ | $P_3$ | $P_4$ |

FIG-1

PARALLEL TO SERIAL CONVERTER

BACKGROUND OF THE INVENTION

1. Field of the Invention

The present invention relates to digital recording channel electronics, and particularly to parallel to serial conversion for such applications. In digital recording channels of the form utilized with magnetic storage media, such as disk and tape, it is common to encode data internal to the system into particular symbol form to accommodate characteristics of the channels of the system. This is also true with communications systems. For example, with GCR encoding, a number of parallel internal bits such as a byte (8 bits) are usually encoded into a larger number of parallel bits, required to meet constraints imposed by the channel characteristics when tape is the recording media or multiple recording channels are usually employed. In handling the encoded symbols, it is necessary to accomplish parallel to serial conversion, in the sense that a parallel encoded format must be converted to a serial bit stream for shifting onto a given recording channel. When a stream of encoded symbols is provided for multiple channels, the loading of a sequence of the channels is distributed through the period of one of the symbols shifting onto a given channel.

2. Description of the Prior Art

It has been usual, in recording channel design, to utilize a single encoder for producing the desired groups or symbols of encoded bits. This is usually accomplished by using a number of parallel to serial shift registers equal in number to the number of channels. While parallel to serial conversion using such hardware is suitable, it results in fairly high cost for channel hardware inasmuch as a matrix of shift registers for a nine-channel data recording system would include a relatively large number of register cells or flip flops.

Other conversion or multiplexing systems have been utilized. For example, U.S. Pat. No. 3,914,553 describes a network with serial to parallel conversion or parallel to serial. However, in FIG. 2 of that patent a matrix of shift register cells is illustrated which is relatively costly, as well. In addition, U.S. Pat. No. 3,267,460 shows a serial to parallel or parallel to serial digital converter which utilizes a large number of cells in the conversion hardware.

Accordingly, a need exists for a parallel to serial converter for recording channel or time division multiplexed applications with reduced hardware cost.

SUMMARY OF THE INVENTION

Accordingly, it is an object of the invention to provide an improved parallel to serial converter which utilizes fewer register cells than prior art systems.

This and other objects and features of the invention are obtained in a parallel to serial converter especially adapted for recording channel applications. The converter includes multiple input terminals adapted to receive parallel coded symbol inputs. The input terminals are associated with a variable delay unit, wherein each bit received by an input terminal is delayed incrementally by a predetermined amount depending upon the input line upon which it is received. Thus, where a four-bit symbol pattern is utilized, the input to one line will be delayed three intervals, the input to a second line will be delayed two intervals, and the input to the third line will be delayed one interval.

The variable delay unit provides a number of parallel outputs equal in number to the input terminal. The variable delay outputs are provided as inputs to a selector array which also receives timing signal inputs. The selector array is comprised of a combination of AND and OR gates which are sequentially controlled to provide serial patterns on various output lines which represent the desired parallel to serial converted symbols. The selector array is interconnected with an output register which is utilized to reclock the serial data streams prior to further channel processing.

DETAILED DESCRIPTION OF THE DRAWINGS

Other features and advantages of the invention will become apparent from the following detailed description, taken in conjunction with the accompanying drawings wherein:

FIG. 1 represents a symbol output sequence; and

DETAILED DESCRIPTION OF THE INVENTION

Figure 2:
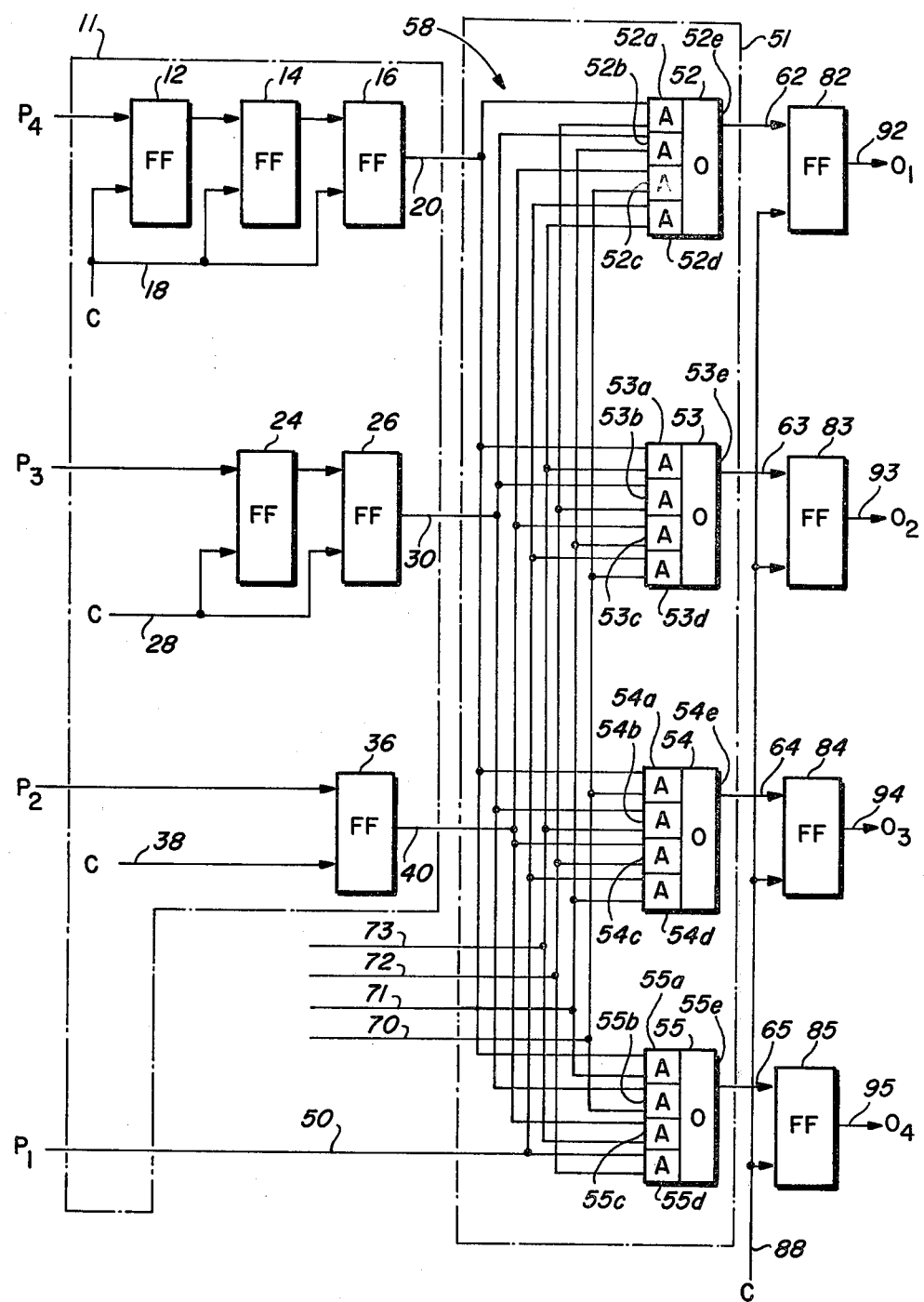
FIG. 2 is a schematic illustration of one embodiment of the invention designed to produce the symbol output sequence of FIG. 1.

Referring now to the drawings, an embodiment of the invention is illustrated comprising a parallel to serial converter adapted to receive parallel formatted four-bit symbol combinations on input terminals P1–P4, respectively, and to convert such symbol patterns to corresponding serial symbol patterns on output lines 01–04, respectively.

It should be recognized that in the usual system, such as a nine-track tape recording storage device, it would be usual to utilize a code having more than four bits. In such case, the parallel to serial converter of the invention would include a higher plurality of input lines and a corresponding higher plurality of output lines, whereby a similar pattern would be developed.

In FIG. 2, input lines P1–P4 are provided to a variable delay section indicated by numeral 11 in dotted outline. The upper-most part of the variable delay section includes flip flops 12, 14 and 16 arranged in serial fashion, whereby each flip flop will selectively delay an input pulse on input P4 for a single timing interval T and then transfer the data bit to the next flip flop when clocked by a common clock signal via conductor 18, for example. Thus, a data bit input on terminal T4 will be delayed three time intervals and then provided on an output conductor 20 of the variable delay section.

In similar fashion, data bits input on terminal P3 are delayed two counts by flip flops 24, 26, and then provided on output line 30 in response to common clocking signals provided on conductor 28. Input bits to terminal P2 are delayed by flip flop 36 and then provided on conductor 40 when the flip flop receives a common clocking signal via conductor 38. Finally, data bits received on input terminal P1 are provided without delay on conductor 50 which comprises the last output to the variable delay section.

Output conductors 20, 30, 40 and 50 serve as input circuits to the selector array indicated in dotted outline by numeral 51. The selector array includes AND/OR gate combinations 52, 53, 54 and 55, respectively. Each AND/OR gate combination is identical and includes four AND gates, each having a pair of input terminals and an output which serves as an input to the OR gate associated therewith. The OR gates provide outputs of the selector array, identified by numerals 62-65, respectively. The individual AND gates in each array are indicated by the numerals a-d, respectively, and the OR gates are designated by the letter e.

An interconnection conductor array generally indicated by numeral 58 allocates the outputs of the variable delay section to various input terminals of the AND gates. Thus, the signals appearing on conductor 20 are allocated to the a gates of arrays 52, 53, 54 and 55. In similar fashion, the signals appearing on conductor 30 are received on one of the inputs to gates 52b, 53b, 54b and 55b.

In similar fashion, output signals on conductor 40 are supplied to an input of the c AND gates; and the signals on conductor 50 are supplied as inputs to one terminal of the d AND gates.

In addition, timing signals T1-T4 are provided to the selector array in the manner illustrated. Thus, T1 input signals are provided via conductor 70 and one of the input terminals of AND gates 52c, 53d, 54a and 55b. In similar fashion, in timing signals T2 are provided via conductor 71 as inputs to AND gate 52b, 53c, 54d and 55a.

As shown, timing signals T3 are provided via conductor 72 as input signals to AND gates 52a, 53b, 54c and 55d. Finally, timing signals T4 are provided via conductor 73 as inputs to AND gates 52d, 53a, 54b and 55c.

The output on conductor 62 of the selector array is provided as an input to flip flop 82 of an output timing register; output 63 comprises an input to flip flop 83 of the output register; output 64 serves as an input to flip flop 84 and output 65 is an input to flip flop 85 of the output register. Each of these flip flops receives a common clocking circuit signal via conductor 88 from the common clocking source, not illustrated. The outputs of flip flops 82-85 appear on conductors 92-95, respectively, and comprise the output terminals 01-04 represented in FIG. 1.

It should be apparent that, in operation, inputs comprising parallel symbol codes P1-P4 are provided at the inputs of the convertor and timing signals T1-T4 are provided in sequence to conductors 70-73. The application of the timing signals and cooperation of the flip flops of the variable delay section result in the provision on output conductor 92 of a converted serial pulse string as illustrated in FIG. 1. Thus, beginning with time T1, a sequence P2, P3, P4, P1, P2, P3 will appear on output line 01. In similar fashion, output line 02 will receive a serial pulse train comprised of pulses P1, P2, P3, P4, etc. Thus, the reception of a parallel code signal on inputs P1-P4 results in the provision of four staggered pulse strains on outputs 01-04 which can be utilized in particular fashion in other portions of the recording channel.

It should be recognized that the gates of the selector array, although illustrated in a single bank in the disclosed embodiment, could be distributed within the system. For example, some of the gates could be located between stages of the delay flip flops and still perform the desired function. This would be more convenient in the event the invention were to be implemented in certain L.S.I. technologies.

In the event that, for example, a nine-channel system is to be utilized, along with a nine-symbol code, then nine input lines would be utilized and the first input line would include eight delay cells or flip flops. It should be apparent that using such a system, the number of flip flops or register cells has been decreased from 81 to 36 cells, or from 81 to 45 cells if output register cells are included. Thus, in the embodiment illustrated in FIG. 2, a total of six flip flops are utilized, or ten including the output register. In the usual register matrix, four registers of four cells each would be required, or a total of 16 cells.

In addition, since the flip flops disclosed in this embodiment are used in the shift only mode, they require only a single data input rather than the dual data input of the usual matrix flip flop. This results in additional economy in fabrication of the disclosed system.

Consequently, the invention described herein results in suitable parallel to serial data conversion with a significant reduction in hardware since the AND/OR gate combinations are much less expensive.

It should also be recognized that the concepts embodied in the described parallel to serial conversion system could be employed, as well, to perform serial to parallel conversion. In particular, this would be possible with respect to communications systems such as those described in the aforementioned prior art.

While the invention has been particularly shown and described with reference to preferred embodiments thereof, it will be understood by those skilled in the art that various changes in form and details may be made therein without departing from the spirit and scope of the invention:

What is claimed is:

1. In a parallel to serial conversion system,
variable delay means adapted to receive a plurality of input signals on parallel input lines with a different number of shift register cells being provided for each input line, each of said cells imparting a fixed delay to the transmission characteristic of said line, to delay the input signals on each of said lines by a different predetermined interval,
output register means having a plurality of output register cells and output signal terminals corresponding in number to the input lines, with all of the cells being clocked from a single timing input terminal, and selector, array means comprising a plurality of AND gates and a single OR gate associated with each output register cell, and circuit means interconnected between the delay means and the AND gates whereby each of the delayed input signals is allocated to a different one of said output register lines.

2. The parallel to serial converter of claim 1 wherein four input lines are included with one of the input lines including three delay shift register cells, a second input line including two delay shift register cells and a third input line including a single delay shift register cell.

* * * * *